United States Patent [19]

Gliha, Jr.

[11] Patent Number: 5,153,540
[45] Date of Patent: Oct. 6, 1992

[54] CAPACITOR ARRAY UTILIZING A SUBSTRATE AND DISCOIDAL CAPACITORS

[75] Inventor: Edward R. Gliha, Jr., Bainbridge, N.Y.

[73] Assignee: Amphenol Corporation, Wallingford, Conn.

[21] Appl. No.: 678,147

[22] Filed: Apr. 1, 1991

[51] Int. Cl.⁵ .................. H03H 7/01; H01R 13/66
[52] U.S. Cl. .................... 333/182; 333/183; 361/302; 439/620
[58] Field of Search ............ 333/12, 181–185; 439/620, 607–610; 361/302, 307, 328, 330

[56] References Cited

U.S. PATENT DOCUMENTS

| | | | |
|---|---|---|---|
| 3,266,125 | 8/1966 | Tobolski | 29/832 |
| 3,290,756 | 12/1966 | Dreyer | 29/832 |
| 3,530,411 | 9/1970 | Sear | 333/243 |
| 3,538,464 | 11/1970 | Walsh | 333/182 |
| 3,879,691 | 4/1975 | Fritz | 333/182 |
| 4,083,022 | 4/1978 | Nijman | 333/183 |
| 4,109,296 | 8/1978 | Rostek et al. | 361/401 |
| 4,144,509 | 3/1979 | Boutros | 333/181 |
| 4,493,007 | 1/1985 | Sugitani | 361/307 |
| 4,563,659 | 1/1986 | Sakamoto | 333/181 |
| 4,673,900 | 6/1987 | Blamire et al. | 333/167 |
| 4,952,896 | 8/1990 | Dawson, Jr. | 333/182 |
| 5,023,577 | 6/1991 | Drake | 333/182 |
| 5,032,809 | 7/1991 | Chamber et al. | 333/182 |

*Primary Examiner*—Eugene R. LaRoche
*Assistant Examiner*—Seung Ham
*Attorney, Agent, or Firm*—Bacon & Thomas

[57] ABSTRACT

A planar filter array includes a single monolithic alumina substrate having a plurality of counter bores on each side connected by central bores to form passages for insertion of connector pin contacts. The connecting bores contain ferrite beads and the counter bores contain discoidal capacitors which sandwich the ferrite beads to form pi filter circuits for filtering the pin contacts. Grounding electrodes on the discoidal capacitors are soldered to a grounding layer or traces on the substrate to provide a ground path for the fiters.

31 Claims, 2 Drawing Sheets

(a)

(b)

CAPACITOR ARRAY UTILIZING A SUBSTRATE AND DISCOIDAL CAPACITORS

BACKGROUND OF THE INVENTION

1. Field of the Invention

The present invention relates to filtered electrical connectors of the type utilizing planar monolithic filter arrays.

2. Description of Related Art

It is known to provide electrical filters in connectors for the purpose of protecting sensitive components from transient currents and voltages which develop in a transmission cable due to electromagnetic and radio frequency interference. Such transients are generally high frequency in nature, and therefore capacitive or tuned pi circuits are used to shunt the transients to ground without affecting the primary signal carried by the cable.

Conventional designs generally fall into one of two categories: The first category includes filter connectors in which monolithic capacitor blocks are used. The capacitor blocks generally consist of a planar block of dielectric material with interleaved ground and hot electrodes arranged to be electrically connected with pins inserted through holes in the blocks. Such blocks are convenient but are disadvantageous in that customizing of capacitances for individual pins is difficult, due to limitations of the single dielectric material used for the block and also the need for additional manufacturing steps and tooling. Moreover, if any one capacitor is defective, the unit must be replaced. When combined with ferrite blocks or tubes to form pi filters, problems arise in combining the two ceramics, ferrite and dielectric, and subsequent electroding is relatively difficult.

The second category of prior capacitive or pi filter designs involves utilizing discrete cylindrical capacitor or pi filters which are formed as filter sleeves for the pins and are grounded to the connector shell through a conductive ground plate which can be metal (normally plated) or a metalized dielectric ground plate. These designs are disadvantageous in that the filter sleeves are fragile and require relatively complicated grounding arrangements. In addition, the use of ceramic supporting blocks increases the risk of damage to the arrays.

BRIEF SUMMARY OF THE INVENTION

It is an objective of the invention to overcome the disadvantages of conventional filter connector designs by providing a filtered electrical connector utilizing a monolithic capacitor array design which is less complicated, and at the same time less fragile than conventional designs.

It is a further objective of the invention to provide a filtered electrical connector including a capacitor array formed from a single high-strength metal oxide substrate in conjunction with low-cost discoidal capacitors.

It is a still further objectives of the invention to provide a filtered electrical connector including a pi filter array formed from a single high-strength metal oxide substrate in conjunction with low-cost discoidal capacitors.

In order to achieve the objectives of the invention, a preferred embodiment of the invention includes a planar filter array formed from a single alumina substrate or circuit board having a plurality of counter bores on each side and a connecting bore between the respective counter bores on each side of the substrate. Ferrite beads are inserted into the connecting bores and small ceramic monoblock capacitors of the type including interleaved buried electrodes are inserted into the counter bores to form pi circuits, the ferrite beads being sandwiched between respective capacitors to form pi filters. This arrangement permits both capacitance values and filter types to be easily mixed within the array.

DETAILED DESCRIPTION OF THE PREFERRED EMBODIMENT

Figure 1:
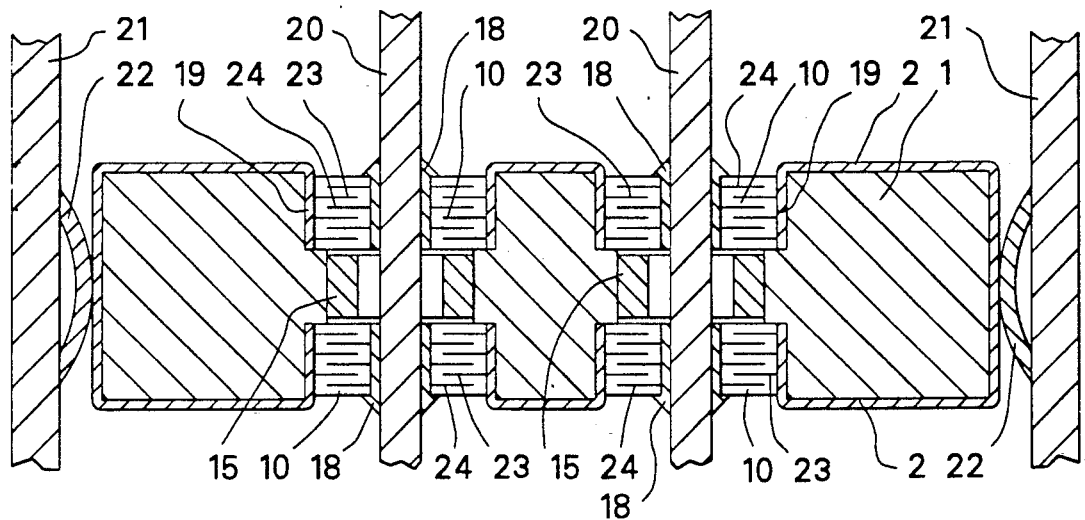
FIG. 1 is a cross-sectional view of a planar capacitor array according to a preferred embodiment of the invention.
Figure 2:
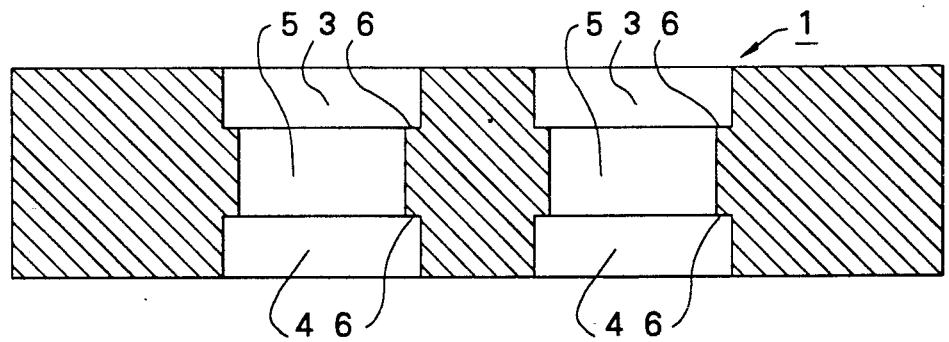
FIG. 2 shows the substrate of FIG. 1 with filter elements removed.

FIG. 1 is a cross-sectional view of a planar filter array according to a preferred embodiment of the invention. The planar filter array of FIG. 1 includes a substrate or circuit board 1. Substrate 1 is preferably made of a high-strength crystalline metal oxide material such as alumina, although similar high-strength metal oxide materials may be substituted. The alumina substrate replaces conventional filter supports and is arranged as follows:

Exterior surfaces of substrate 1 include a conductive common external ground electrode 2 which may be in the form of discrete traces or a uniform coating or layer on the outside of the substrate. In either case, any conventional coating, plating, or trace-applying technique may be used to apply the ground coating. When placed in a connector shell 21, common ground electrode 2 may be connected thereto by any suitable means, numerous ones of which are known, for example by electrically conductive springs 22.

Provided in substrate 1 are a plurality of cylindrical counter bores 3 and 4 each of which communicates with a cylindrical central connecting bore 5 connecting the counter bores on each side of the substrate. Connecting bores 5 are preferably narrower than counter bores 3 and 4 to form annular shoulders 6, as will be described in more detail below. External common ground electrode 2 may extend into counterbores 3 and 4, but it may be also applied solely to the principal external surfaces of the substrate before forming counterbores 3 and 4. It will of course be appreciated that bores 3-5 need not necessarily be cylindrical in shape, but rather may have any shape necessary to accommodate the shape of the filter elements to be inserted into the bores.

Figure 3:
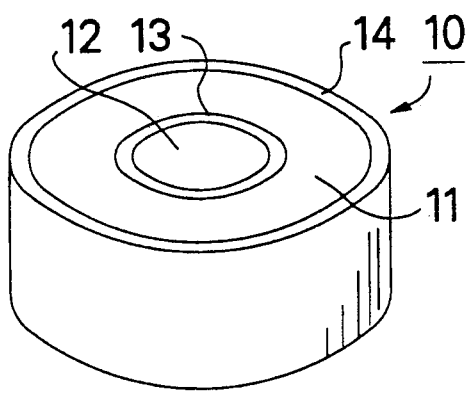
FIG. 3a is a perspective view of a discoidal capacitor suitable for use in the planar filter array of FIG. 1.
FIG. 3b is a perspective view of a ferrite bead suitable for use in the planar filter array of FIG. 1.
Figure 3:
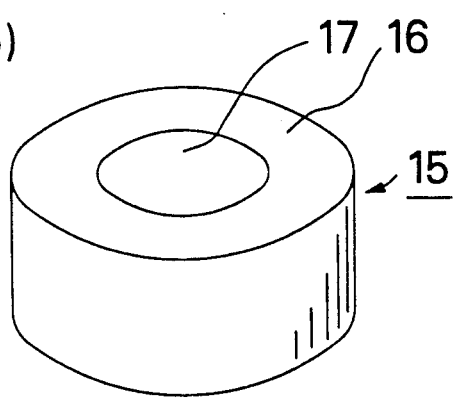
Figure 4:
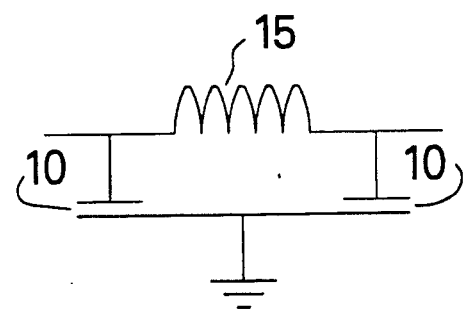
FIG. 4 is a circuit diagram of the pi filter shown in connection with the preferred embodiment of FIG. 1.

As shown in FIG. 3a, the capacitors 10 provided in counterbores 3 and 4 are preferably discoidal capacitors, although other filter elements may be substituted. Each capacitor 10 includes an annular dielectric body 11 having a central bore 12, a circumferential ground electrode 14 for connection with common external ground electrode 2, and an inner hot or live electrode 13 to be electrically connected with one of pin contacts 20. Capacitance is established by interleaved electrodes 23 and 24 provided in the dielectric body and extending alternately from the ground and hot electrodes. Because the capacitors are discrete units, their capacitance values need not all be the same, but rather may easily be varied if desired.

The pi filter inductors 15 each consist of an annular ferrite bead 16 although, again, other monolithic filter elements may be substituted. Ferrite bead 16 includes a central bore 17 through which the pin contacts 20 are inserted. Ferrite beads 15 fit within bores 5 as discussed above.

In order to assemble the filter array of the preferred embodiment, ferrite bead 15 is first inserted into bore 5 and secured to the substrate by a suitable adhesive or other supporting means. The discoidal capacitors 10 are then inserted into respective counter bores 3 and 4 from opposite sides of the substrate to sandwich the ferrite bead. The discoidal capacitors rest on annular shoulders and are preferably soldered, as indicated by reference numeral 19, to common external ground 2 in order to establish electrical connection between the common ground electrode and the ground electrodes 14 of the capacitors. Although soldering is preferred, other means of securing the discoidal capacitors in the counter bores, such as use of electrically conductive adhesive or a conductive retention spring may be substituted.

The final step in the assembly process is simply to insert pin contacts 20 through bores 12 and 17 of the respective capacitors and the ferrite beads and to electrically connect the pins to the hot electrodes 13 of the capacitors by soldering, as indicated by reference numeral 18, or by use of a suitable adhesive or retention spring.

It will of course be appreciated by those skilled in the art that the monolithic substrate and pi filter arrangement may be modified within the scope of the invention to include a variety of different filter structures. Discoidal filter elements other than capacitors, for example, may be substituted for one or more of the capacitors used in the preferred embodiment. In addition, one or more of the ferrite beads may be omitted and/or replaced by other filter elements. The filter substrate itself may be used in a variety of different connector configurations, so long as some means is provided to establish an electrical connection between the connector shell and the common external ground 2 on the substrate.

Numerous other variations of the invention will undoubtedly occur to those skilled in the art and, therefore, it is intended that the invention not be limited to the specific embodiment discussed above, but rather that it be defined solely by the appended claims.

I claim:

1. A filter array for use in a connector, comprising:
   a planar substrate having two principal exterior surfaces on opposite sides of said substrate and a plurality of counter bores in each of said two principal exterior surfaces, wherein corresponding ones of said counter bores on one side of said substrate are connected to corresponding ones of said counter bores on the other side of said substrate by connecting bores which communicate with respective counter bores on each side of the substrate;
   a plurality of first filter elements within said counter bores; and
   grounding means on said exterior surfaces for electrically connecting said first filter elements to an external ground.

2. A planar filter array for use in a connector, comprising:
   a planar substrate having two principal exterior surfaces on opposite sides of said substrate and a plurality of counter bores in each of said two principal exterior surfaces, wherein corresponding ones of said counter bores on one side of said substrate are connected to corresponding ones of said counter bores on the other side of said substrate by connecting bores which communicate with respective counter bores on each side of the substrate; and
   a plurality of first filter elements within said counter bores, further comprising a plurality of second filter elements within said connecting bores, said first filter elements sandwiching said second filter elements.

3. A filter array for use in a connector, comprising:
   a substantially non-conductive planar ceramic support substrate having two principal exterior surfaces on opposite sides of said substrate and a plurality of counter bores in each of said two principal exterior surfaces, wherein corresponding ones of said counter bore on one side of said substrate are connected to corresponding ones of said counter bores on the other side of said substrate by connecting bores which communicate with respective counter bores on each side of the substrate; and
   a plurality of first filter elements within said counter bores.

4. A filter array as claimed in claim 1, wherein said grounding means comprises a conductive layer on said principal exterior surfaces of said substrate.

5. A filter array as claimed in claim 1, wherein said grounding means comprises conductive traces on said principal exterior surfaces of said substrate.

6. A planar filter array as claimed in claim 1, wherein said grounding means comprises solder located between ground electrodes on said first filter elements and a conductive coating on said principal exterior surfaces of said substrate.

7. A filter array as claimed in claim 2, wherein said second filter elements are ferrite beads and said filter elements are discoidal capacitors, said first and second filter elements together forming pi filters for contact pins inserted through pin receiving bores in each of said first and second filter elements.

8. A filter array claimed in claim 7, wherein said substrate includes an external common grounding electrode on each principal exterior surface, and said capacitors comprise an outer ground electrode and an inner hot electrode, said hot electrode being soldered to said pins and said outer ground electrode being soldered to one of said external common grounding electrodes.

9. A planar filter array for use in a connector, comprising:
   a planar substrate having two principal exterior surfaces on opposite sides of said substrate and a plurality of counter bores in each of said two principal exterior surfaces, wherein corresponding ones of said counter bores on one side of said substrate are connected to corresponding ones of said counter bores on the other side of said substrate by connecting bores which communicate with respective counter bores on each side of the substrate; and
   a plurality of first filter elements within said counter bores, wherein said first filter elements are discoidal capacitors.

10. A planar filter array as claimed in claim 1, wherein said counter bores and connecting bores are cylindrical and said connecting bores are smaller in diameter than said counter bores, such that annular shoulders are formed at inner surfaces of said counter bores to provide supporting means for said first filter elements.

11. A planar filter array as claimed in claim 1, wherein said substrate is made of alumina.

12. A planar filter array for use in a connector, comprising:
a planar substrate having two principal exterior surfaces on opposite sides of said substrate and a plurality of counter bores in each of said two principal exterior surfaces, wherein corresponding ones of said counter bores on one side of said substrate are connected to corresponding ones of said counter bores on the other side of said substrate by connecting bores which communicate with respective counter bores on each side of the substrate; and
a plurality of first filter elements within said counter bores, wherein said first filter elements are capacitors and two of said capacitors have different capacitance values from each other.

13. A planer filter array for use in a connector, comprising:
a planar substrate having two principal exterior surfaces on opposite sides of said substrate and a plurality of counter bores in each of said two principal exterior surfaces, wherein corresponding ones of said counter bores on one side of said substrate are connected to corresponding ones of said counter bores on the other side of said substrate by connecting bores which communicate with respective counter bores on each side of the substrate; and
a plurality of first filter elements within said counter bores, wherein said first filter elements comprise means defining a central pin receiving bore in each first filter element for receiving a connector contact pin, a live electrode located on a surface of each central pin receiving bore, and means for electrically connecting said live electrode to said contact pin.

14. In a filter connector including
an electrically conductive connector shell;
a planar filter array having a common external ground electrode; and
means for electrically connecting said common external ground electrode to said connector shell;
the improvement wherein said planar filter array comprises:
a planar substrate having two principal exterior surfaces on opposite sides of said substrate and a plurality of counter bores in each of said two principal exterior surfaces, wherein corresponding ones of said counter bores on one side of said substrate are connected to corresponding ones of said counter bores on the other side of said substrate by connecting bores which communicate with respective counter bores on each side of the substrate;
a plurality of second filter elements within said connecting bores;
a plurality of first filter elements within said counter bores, wherein said second filter elements sandwich said first filter elements and said ground electrode is located on at least one of said exterior surfaces of said substrate.

15. A filter connector as claimed in claim 14, wherein said common ground electrode comprises a conductive layer or traces on said principal external surfaces of said substrate.

16. A filter array as claimed in claim 14, wherein said second filter elements are ferrite beads and said first filter elements are discoidal capacitors, said first and second filter elements together forming pi filters for contact pins inserted through pin receiving bores in each of said first and second filter elements.

17. A filter array as claimed in claim 16, wherein said substrate includes an external common grounding electrode on each principal exterior surface, and said capacitors comprise an outer ground electrode and an inner hot electrode, said hot electrode being soldered to said pins and said outer ground electrode being soldered to one of said external common grounding electrodes.

18. A filter array as claimed in claim 14, wherein said first filter elements are discoidal capacitors.

19. A planar filter array as claimed in claim 14, wherein counter bores and connecting bores are cylindrical and said connecting bores are smaller in diameter than said counter bores, such that annular shoulders are formed at inner surfaces of said counter bores to provide supporting means for said first filter elements.

20. A planar filter array as claimed in claim 14, wherein said substrate is made of alumina.

21. A planar filter array as claimed in claim 14, wherein said first filter elements are capacitors and two of said capacitors have different capacitance values from each other.

22. A planar filter array as claimed in claim 14, wherein said first filter elements comprise means defining a central pin receiving bore in each first filter element for receiving a connector contact pin, a live electrode located on a surface of each central pin receiving bore, and means for electrically connecting said live electrode to said contact pin.

23. A method of assembling a filter array for use in a connector, comprising the steps of:
providing a planar substrate having two principal exterior surfaces;
forming a plurality of counter bores in each of said two principal exterior surfaces;
forming connecting bores to connect corresponding ones of said counter bores with each other;
applying a conductive layer on each principal surface of said substrate to form an external common ground electrode for filter elements to be located in said bores;
inserting second ones of said filter elements into respective ones of said connecting bores;
inserting first ones of said filter elements into respective ones of said counter bores;
electrically connecting individual ground electrodes on said first filter elements to a respective one of said common ground electrodes.

24. A method as claimed in claim 23, wherein said step of electrically connecting said individual ground electrodes to said common ground electrodes comprises the step of soldering.

25. A method as claimed in claim 23, further comprising the step of providing said first filter elements in the form of discoidal capacitors.

26. A method as claimed in claim 23, further comprising the step of providing said second filter elements in the form of ferrite filter beads.

27. A method of assembling a filter connector, comprising the steps of:
providing a planar substrate having two principal exterior surfaces;

forming a plurality of counter bores in each of said two principal exterior surfaces;

forming connecting bores to connect corresponding ones of said counter bores with each other;

applying a conductive layer on each principal surface of said substrate to form an external common ground electrode for filter elements to be located in said bores;

inserting second ones of said filter elements into respective ones of said connecting bores;

inserting first ones of said filter elements into respective ones of said counter bores;

electrically connecting ground electrodes on said second filter elements to a respective one of said common ground electrodes;

inserting the substrate into an electrically conductive connector shell; and electrically connecting said common ground electrodes to said electrical connector shell.

28. A method as claimed in claim 27, further comprising the steps of inserting connector contact pins through central pin receiving bores in said first and second filter elements and electrically connecting live electrodes in said first filter elements to said contact pins.

29. A method as claimed in claim 28, wherein the step of electrically connecting live electrodes to said contact pins comprises the step of soldering.

30. A method as claimed in claim 28, further comprising the step of providing said first filter elements in the form of discoidal capacitors.

31. A method as claimed in claim 28, further comprising the step of providing said second filter elements in the form of ferrite filter beads.

* * * * *